(12) United States Patent
Hicks et al.

(10) Patent No.: US 8,937,474 B2
(45) Date of Patent: Jan. 20, 2015

(54) SIMPLE MAGNETOMETER FOR DETERMINING ORIENTATION OF LOW INTENSITY MAGNETIC FIELDS

(75) Inventors: Theron J. Hicks, Grand Rapids, MI (US); Jason L. Reene, Holland, MI (US); Thomas Wright, Holland, MI (US)

(73) Assignee: Johnson Controls Technology, Holland, MI (US)

( * ) Notice: Subject to any disclaimer, the term of this patent is extended or adjusted under 35 U.S.C. 154(b) by 233 days.

(21) Appl. No.: 13/637,447

(22) PCT Filed: Mar. 31, 2011

(86) PCT No.: PCT/US2011/030635
§ 371 (c)(1),
(2), (4) Date: Sep. 26, 2012

(87) PCT Pub. No.: WO2011/159388
PCT Pub. Date: Dec. 22, 2011

(65) Prior Publication Data
US 2013/0015852 A1    Jan. 17, 2013

Related U.S. Application Data

(60) Provisional application No. 61/319,920, filed on Apr. 1, 2010.

(51) Int. Cl.
*G01R 33/02* (2006.01)
*G01R 33/00* (2006.01)
*G01R 33/028* (2006.01)
*G01R 33/04* (2006.01)

(52) U.S. Cl.
CPC .......... *G01R 33/0023* (2013.01); *G01R 33/028* (2013.01); *G01R 33/04* (2013.01)
USPC ........................................... 324/244; 324/260

(58) Field of Classification Search
None
See application file for complete search history.

(56) References Cited

U.S. PATENT DOCUMENTS

| 3,461,382 | A |   | 8/1969  | Anderson |
|-----------|---|---|---------|----------|
| 5,239,264 | A | * | 8/1993  | Hawks ........................... 324/253 |
| 5,744,956 | A |   | 4/1998  | Hawks |
| 6,384,596 | B1| * | 5/2002  | Beyer ....................... 324/207.16 |
| 7,285,964 | B1|   | 10/2007 | Hsu et al. |

OTHER PUBLICATIONS

PCT International Search Report—PCT/US2011/030635.

* cited by examiner

*Primary Examiner* — Minh N Tang

(57) ABSTRACT

The disclosure relates to a magnetometer in which direction of the Earth's magnetic field is determined on the basis of time variant differences in the inductance of a sensor coil of the digital compass which is a function of the orientation of the sensor coil with respect to the Earth's magnetic field. The magnetometer includes a sensing coil, a feedback resistor, and a comparator.

12 Claims, 1 Drawing Sheet

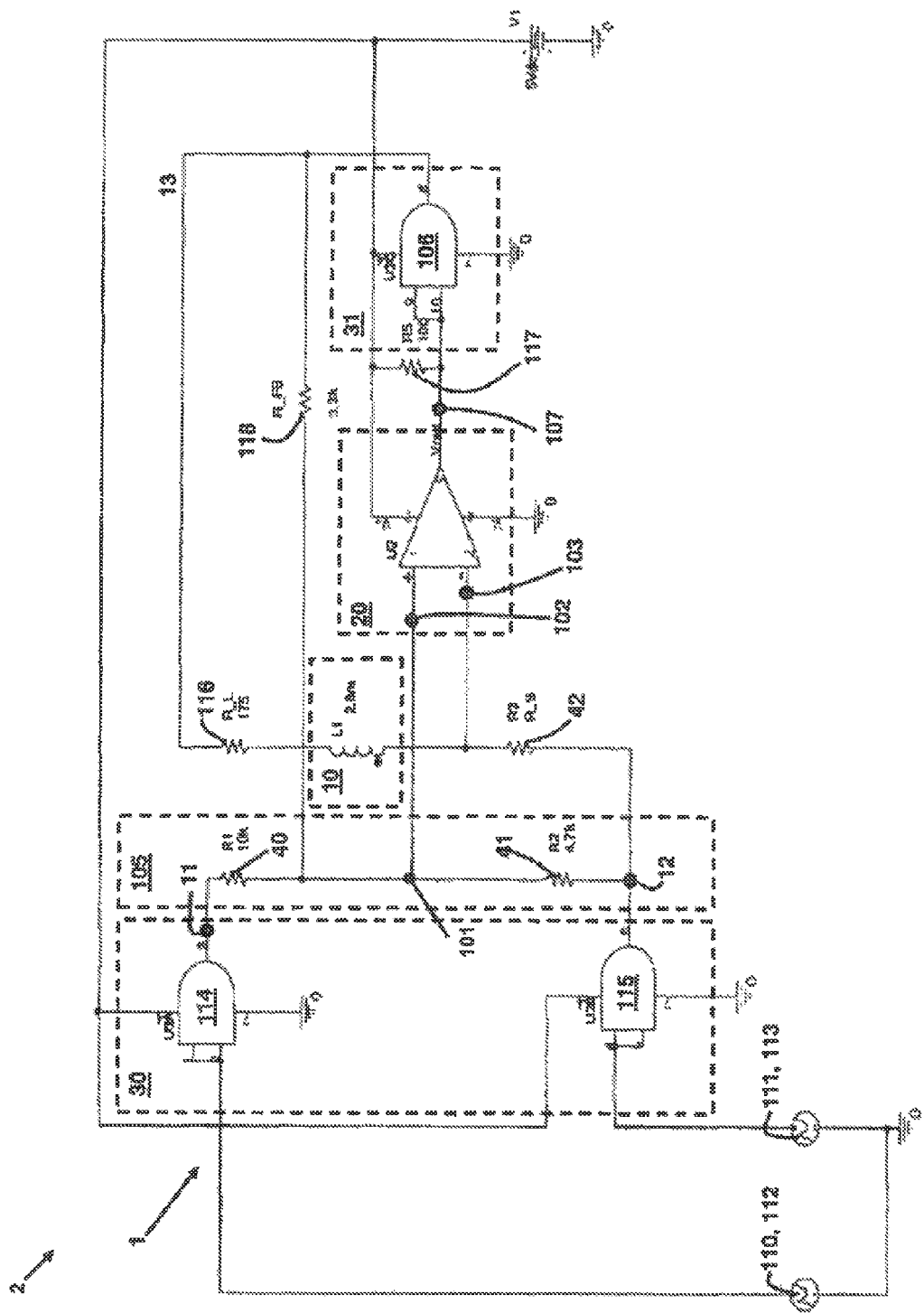

SIMPLE MAGNETOMETER FOR DETERMINING ORIENTATION OF LOW INTENSITY MAGNETIC FIELDS

CLAIM OF PRIORITY

The present application claims the benefit of the filing date of U.S. Provisional Application Ser. No. 61/319,920 (filed Apr. 1, 2010) and the entirety of the contents of this application being hereby expressly incorporated by reference.

BACKGROUND OF THE INVENTION

1. Field of the Invention

This invention relates to a magnetometer in which direction of the Earth's magnetic field is determined on the basis of time variant differences in the inductance of a sensor coil of the digital compass which is a function of the orientation of the sensor coil with respect to the Earth's magnetic field. The present invention furthermore refers to a digital compass, in particular for mobile applications, comprising a suchlike magnetometer. It further relates to a novel form of a magnetometer which has general application for determining orientation of weak magnetic fields based on frequency differences, especially for mobile applications, e.g. automotive applications, maritime applications, outdoor activities, airplanes or the like.

2. Description of the Prior Art

A variety of digital compasses and magnetometers are known in the art, e.g. U.S. Pat. Nos. 4,851,775 or 5,239,264.

While the art relating to the design of digital compasses and magnetometers is thus a well-developed one, a need remains for development of a simple, reliable, low cost digital compass suitable for consumer use and a simple magnetometer for determining orientation of low intensity magnetic fields.

Especially, digital compasses according to the prior art generally have the disadvantage that an ASIC (Application Specific Integrated Circuit) is used together with the sensing element, i.e. related to a sensing circuit. This increases the overall cost for the digital circuit.

DESCRIPTION OF THE INVENTION AND OF THE DRAWING

An object of the present invention is therefore to provide a magnetometer without the disadvantages of the prior art and which can be implemented with a simple digital circuit and which is sufficiently low cost for consumer applications.

The problem is solved by a sensing circuit and a measurement circuit, the sensing circuit comprising a sensing coil and a comparator circuit means, the measurement circuit comprising a microcontroller means, wherein the comparator circuit means and the microcontroller means are integrated in an integrated circuit (IC).

Thereby, it is advantageously possible to eliminate the need for an ASIC (Application Specific Integrated Circuit) in relation to the sensing circuit, i.e. it is possible that those components (such as a comparator) needed' in the sensing circuit are provided by components of the measurement circuit, especially by the integrated circuit realizing the microcontroller means.

Another subject of the present invention is a magnetometer comprising a relaxation oscillator build up by a sensing coil, a feedback resistor and a comparator, wherein an output node of the comparator is connected via the feedback resistor to a first input node of the comparator and via the sensing coil to a second input node of the comparator, wherein the first input node is controllable by an alternating first input signal and wherein the second input node is controllable by an inversely alternating second input signal.

According to the present invention, it is advantageously possible that an analog multiplexer, which is used in magnetometers known from the prior art in order maintain symmetry between the N-S and S-N operation, is not required. The magnetometer according to the present invention symmetry is obtained by switching the drive polarity of the first and second input nodes by the first and the second input signals (in the following also referred to as control and control-bar input). If the control input is held at a logic "1" (e.g. approximately 5 Volts DC) then the control-bar input is held at a logic "0" (e.g. approximately 0 Volts DC) providing one polarity of current flow. In a subsequent case, the control input is held at a logic "0" (e.g. approximately 0 Volts DC) then the control-bar input is held at a logic "1" (e.g. approximately 5 Volts DC) providing the second polarity current flow. According to a preferred embodiment the first and second input signals are provided by an external voltage source, in particular the microcontroller. Preferably, the comparator and the external voltage source are integrated by the integrated circuit realizing the microcontroller means.

According to a preferred embodiment of the present invention, the magnetometer further comprises a reference string build up by a first and a second resistor which are connected in series between a first node and a second node, wherein a third node between the first and the second resistor is connected to the first input node and wherein the second node is connected via a third resistor to the second input node, wherein the first input signal is applied to the first node and wherein the second input signal is applied to the second node. Advantageously, the first and the second input signal preferably time-dependently inverts the first node, whereas the second input signal time-dependently inverts the second node. Due to this, also the current through the sensing coil is inverted at the same time via the third resistor. The second node is tied to either logical "0" or logical "1" and therefore the first and second input signal controls the current through the sensing coil by means of the third resistor between the second node and the sensing coil. Alternatively, it is conceivable that the reference levels for the comparator (two reference levels for each sensor polarity, for a total of four reference levels provide hysteresis which is necessary for the relaxation oscillator) are provided by other means, e.g. an output of a Digital-Analog-Converter (DAC) internal to the microcontroller or the like.

According to a preferred embodiment of the present invention, the magnetometer comprises a buffering unit for buffering the first and the second input signals in order to provide output drive strength. Preferably, the buffering unit comprises at least a first logical AND-gate and a second logical AND-gate, wherein an output port of the first gate is connected to the first node and the input ports of the first gate are connected to the first external voltage source and wherein an output port of the second gate is connected to the second node and the input ports of the second gate are connected to the second external voltage source.

Another subject of the present invention is a digital compass for a mobile application comprising a magnetometer according to the present invention. A mobile application in the sense of the present inventions comprises e.g. automotive applications, maritime applications, outdoor activities, airplanes or the like.

Another subject of the present invention is a method for operating a magnetometer, wherein a relaxation oscillator is stimulated to oscillate by means of a comparator, wherein the comparator is fed back by a sensing coil and by a feedback resistor, wherein the inductance of the sensing coil is determined by analyzing the oscillating frequency of the relaxation oscillator, wherein a first input node of the comparator is controlled by an alternating first input signal and wherein the second node is controlled by an inversely alternating second input signal. Preferably, the first input signal is provided by a first external voltage source and the second input signal is provided by a second external voltage source, wherein the first and the second external voltage sources are provided by the microcontroller and wherein further the comparator is preferably integrated into the microcontroller.

The already well-known overall functionality of digital compasses and magnetometers are described in detail in U.S. Pat. Nos. 4,851,775 and 5,239,264, which are incorporated herein by reference.

The attainment of the foregoing and related objects, advantages and features of the invention should be more readily apparent to those skilled in the art, after review of the following more detailed description of the invention, taken with the drawings, in which:

FIG. 1 is a schematic representation of the sensing circuit (of one channel) of a digital compass according to the present invention.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes.

Where an indefinite or definite article is used when referring to a singular noun, e.g. "a", "an", "the", this includes a plural of that noun unless something else is specifically stated.

Furthermore, the terms first, second, third and the like in the description and in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the present description and claims, should not be interpreted as being restricted to the means listed thereafter; it does not exclude other elements or steps. Thus, the scope of the expression "a device comprising means A and B" should not be limited to devices consisting only of components A and B. It means that with respect to the present invention, the only relevant components of the device are A and B.

In FIG. 1, a magnetometer 2 and in particular a part of a digital compass comprising a magnetometer 2 according to the present invention is shown.

It is to be understood that only the sensing circuit 1 of one channel of a digital compass is shown, i.e. in the usual case that a multitude of different magnetic directions (or orientations of a device relative to a given magnetic direction, especially the earth's magnetic field) are to be measured or sensed, at least one further sensing circuit needs to be provided. The at least one further sensing circuit comprises a further sensing coil, said further sensing coil having a magnetic axis with a directional component orthogonal to the magnetic axis of the sensing coil. It is conceivable that three different axes of a digital compass are to be measured which implies that two further sensing circuits comprising each a further sensing coil is to be used, said further sensing coils having each a magnetic axis with a directional component orthogonal to the magnetic axis of the sensing coil and also a magnetic axis with a directional component orthogonal to each other.

The magnetometer 2 shown in FIG. 1 comprises a sensing circuit 1 (for one magnetic direction or "channel") having a sensing coil 10, a feedback resistor 118 and a comparator circuit means 20. The comparator circuit means 20 is also called comparator 20 in the context of the present invention. The sensing coil 10 is a magneto-inductive sensor and is also called sensor (or sensor coil) in the context of the present invention. An output node 107 of the comparator 20 is connected via the feedback resistor 118 to a first input node 102 of the comparator 20 in order to feed back the comparator 20. Furthermore, the output node 107 is connected via a series resistor 116 and the sensor coil 10 to a second input node 103 of the comparator 20. In particular, the series resistor 116 is unavoidable a part of the sensor coil 10. The sensing circuit 1 further comprises three resistors 40, 41, 42, (a first resistor 40, a second resistor 41 and a third resistor 42) to set the upper and lower trip points for the comparator 20. The first and the second resistors 40, 41 are connected in series between a first node 11 and a second node 12 in order to form a reference string 105. The second node 12 is connected via the third resistor 42 to the second input node 103, so that the third resistor 42 in connected in series with the sensor coil 10. A third node 101 between the first and the second resistors 40, 41 is connected to the first input node 102. The first input node 102 is controllable by a first input signal 110 applied to the first node 11, wherein the second input node 103 is controllable by a second input signal 111 applied to the second node 12. The first input signal 110 is an alternating signal, wherein the second input signal 112 alternates inversely, so that the current flow through the sensor coil 10 alternates correspondingly (because of the coupling between the second node and the sensor coil 10 via the third resistor 42). The upper and lower trip points for the comparator 20 are adjusted by correspondingly choosing the first, the second and the third resistor 40, 41, 42. In particular, the feedback resistor 118, the first resistor 40 and the second resistor 41 therefore provide a set of reference levels to the comparator 20. These reference levels (two reference levels for each sensor polarity, for a total of four reference levels) provide hysteresis which is necessary for the relaxation oscillator. Furthermore, the feedback resistor 118, the first resistor 40 and the second resistor 41 effectively allows inverting the reference levels in order to provide the necessary reference levels for both sensor polarities. Alternatively, it is conceivable that these reference levels are provided by other means, e.g. an output of a Digital-Analog-Converter (DAC) internal to the microcontroller or the like.

The first input signal 110 is provide by a first external voltage source 112 and the second input signal 111 is provided by a second external voltage source 113. Preferably, the third resistor 42 could be used to limit the current through the sensor coil 10.

The digital compass according to the present invention also comprises a measurement circuit as shown in FIG. 4 of U.S. Pat. No. 4,851,775. As in this representation, the measurement circuit comprises a microprocessor or a microcontroller means. According to the present invention, the comparator 20 of the sensing circuit 1 and the external voltage sources are part of the microcontroller means of the measurement circuit, i.e. the microcontroller means is integrated in an integrated circuit of the measurement circuit. The first external voltage source 112 is a first output pad of the microcontroller and the second external voltage source 113 is a second output pad of the microcontroller, wherein the second pad is driven inversely to the first pad by the microcontroller, for instance.

According to the present invention, the third resistor 42 is used in series with the sensor coil 10. Nevertheless, waveform symmetry between the N-S and the S-N operation (or the E-W and W-E operation) is maintained by the use of the two control inputs (first input signal 110 at the first node 11 and the second input signal 111 at the second input node 12) that are inverted with respect to each other. In the following, the first input signal 110 is also called "control input" and the second input signal 111 is also called "control-bar input". Thereby, both ends of the reference string 105 (first resistor 41 in series with second resistor 42) are inverted and at the same time the current through the sensor coil 10 is inverted by tying the lower end of the third resistor 42 (the second node) to either ground or to VCC (supply voltage). Thereby, it is advantageously possible to avoid the use of an analog multiplexer to maintain symmetry between the N-S and S-N operation. Again, according to the present invention, symmetry is obtained by switching the drive polarity of the control input and control-bar input. If the "control" input (at the first node 11) is held at a logic "1" (e.g. approximately 5 volts DC) then the "control-bar" input (at the second node 12) is held at a logic "0" (e.g. approximately 0 volts DC) providing one polarity of current flow. In the second case, the "control" input (first node 11) is held at a logic "0" (e.g. approximately 0 volts DC) then the "control-bar" input (second node 12) is held at a logic "1" (e.g. approximately 5 volts DC) providing the second polarity of current flow.

The sensing circuit 1 functions as a relaxation oscillator. The difference in the oscillation frequency of this oscillator depends on the inductance of the sensor coil 10. The sensor coil 10 is biased by the sum of the earth's magnetic field and the additional bias magnetic field of the current through the sensor coil 10. This bias field results in a reduction in the effective inductance of the sensor coil 10 and thus a reduction in the oscillating frequency of the sensor coil 10 and in particular of the relaxation oscillator. In the present example, the microcontroller measures the time for a fixed number of oscillation cycles of each sensor coil 10 (if more than one channel is provided) in each polarity. The difference in frequency between the two polarities of the sensor coil 10 depends to the effective magnetic field as perceived by that sensor coil 10. These differences in frequency e.g. are derived by measuring different periods. The present invention is not limited to this kind of reading the frequency. For a person skilled in the art it is clear that these frequency measurements could be performed just as well by any other frequency measuring method using a different kind of microcontroller or hardware setup.

According to the present invention, it is advantageously possible to provide a digital compass having the functionality comparable to known digital compasses without a need for an analog multiplexer. In addition, the comparator 20 is part of the microcontroller and is thus effectively "free".

The sensing circuit 1 shown in FIG. 1 also comprises a buffering unit 30 having components realizing a logical "AND"-functionality and are hereinafter also called "and"-gates 114, 115. These "and"-gates 114, 115, also referred to as first gate 114 and second gate 115, are included in the sensing circuit 1 only optionally, e.g. to provide an optional buffering to ensure solid signals that e.g. closely approach either 5 Volts or 0 Volts as appropriate. The buffering unit 30 is configured for buffering the first and the second input signals 110, 111. In an exemplary embodiment, the buffering unit 30 comprises a first logical AND-gate 114 and a second logical AND-gate 115. An output port of the first gate 114 is connected to the first node 11 and the input ports of the first gate 114 are connected to the first external voltage source 112. In a similar manner, an output port of the second gate 115 is connected to the second node 12 and the input ports of the second gate 115 are connected to the second external voltage source 113.

The sensing circuit 1 furthermore comprises a pull-up resistor 117 that is used only if the comparator 20 is an open-collector type comparator. In a preferred embodiment of the present invention, the "and"-gates 30, 31 can be eliminated in case sufficient drive strength of the microcontroller is available. As an optional feature, the illustrated sensing circuit 1 furthermore comprises an additional AND-gate 106 for buffering an output signal of the comparator 20. The two input ports of the additional AND-gate 106 are connected to each other and to the output node 107 of the comparator 20. The output port of the additional AND-gate 106 is connected to the series resistor 116 and to the feedback resistor 118.

According to the present invention, the sensing circuit 1 is realized without the need of a further ASIC (Application Specific Integrated Circuit) component or integrated circuit (additional to the microcontroller means of the measuring circuit). Therefore, the microcontroller means needs to measure the period (in lieu of measuring the actual frequency) of the oscillation of the compass sensors. This is done by connecting the output 13 of the sensing circuit 1 to a timer capture port (of the microcontroller means). The timer, configured as an Input Capture port, is set up to generate an interrupt for each cycle that it detects from the sensing circuit output 13. For the purposes of this description, the port can be considered to be interrupting on a rising edge (low-to-high transition) of the signal from the sensor, although in practice using the falling edges would be equally acceptable. Because the intensity of the magnetic field is directly indicated by the period of the signal coming from the sensor (sensing circuit output 13), accurate measurement of that period is essential in obtaining the required compass performance. This is accomplished by measuring the period over several cycles instead of only one, and calculating the average period across that interval. Although any duration of adequate length could be used, a length of fifty cycles is preferred so that the resulting period value would be within the same order of magnitude as the data that would have been returned from the ASIC (Application Specific Integrated Circuit). By doing so, compatibility with compass calculation software used with digital compass devices having sensing circuits including an additional ASIC (Application Specific Integrated Circuit) could be provided.

The start and end time of a fifty-cycle duration is measured by the interrupt. The interrupt itself still occurs even on the cycles in between the start and end measurements. During these interrupts, the number of cycles is counted, so that the module can correctly identify and measure the fiftyth cycle. When both the start and end time for the fifty-cycle interval have been captured, the data is stored and the software reconfigures the sensor control signals for the remaining measurements that need to be made. (Each sensor must be operated in both polarities.) When this is complete, the start and end times are converted into durations and this resulting value is passed to the compass software for heading calculations.

Although only certain embodiments of the invention have been described herein, it will be understood by any person skilled in the art that other modifications variations and possibilities of the invention are possible without departing from the broader spirit of the invention. Such modifications, variations and possibilities are therefore to be considered as falling within the spirit and scope of the invention and hence forming part of the invention as herein described and/or exemplified. Accordingly, the specification and drawings are to be regarded in an illustrative sense rather than in a restrictive sense.

REFERENCE SYMBOL LIST 1 sensing circuit
2 magnetometer
10 sensing coil/sensor
11 first node
12 a second node
13 output of the sensing circuit
20 comparator circuit means/comparator
30 buffering unit/components
40 first resistor
41 second resistor
42 third resistor
101 third node
102 first input node
103 second input node
105 reference string
106 additional AND-gate
107 output node
110 first input signal/first control input
111 second input signal/second control input
112 first external voltage source
113 second external voltage source
114 first logical AND-gate
115 second logical AND-gate
116 a series resistor
117 pull-up resistor
118 feedback resistor

The invention claimed is:

1. A magnetometer comprising a relaxation oscillator build up by a sensing coil, a feedback resistor and a comparator, wherein an output node of the comparator is connected via the feedback resistor to a first input node of the comparator and via the sensing coil to a second input node of the comparator, wherein the first input node is controllable by an alternating first input signal and the second input node is controllable by an inversely alternating second input signal;
wherein the first and the second input signals are applied by at least one external voltage source; and
wherein the magnetometer further comprises a reference string build up by a first and a second resistor which are connected in series between a first node and a second node, wherein a third node between the first and the second resistor is connected to the first input node and wherein the second node is connected via a third resistor to the second input node, wherein the first input signal is applied to the first node and the second input signal is applied to the second node.

2. A magnetometer according to claim 1, wherein the comparator is integrated into a microcontroller.

3. A magnetometer according to claim 1, wherein the first input signal is applied by a first external voltage source and the second input signal is applied by a second external voltage source, wherein the first and the second external voltage sources are integrated into a microcontroller.

4. A magnetometer according to claim 1, wherein the magnetometer comprises a buffering unit for buffering the first and the second input signals.

5. A magnetometer in accordance with claim 4, wherein the buffering unit comprises at least a first logical AND-gate and a second logical AND-gate, wherein an output port of the first gate is connected to the first node and the input ports of the first gate are connected to a first external voltage source and wherein an output port of the second gate is connected to the second node and the input ports of the second gate are connected to a second external voltage source.

6. A magnetometer according to claim 5, wherein an output signal of the comparator is buffered by an additional AND-gate, wherein the input ports of the additional AND-gate are connected to the output node of the comparator.

7. A magnetometer according to Claim 1, wherein the output node is connected via a pull-up resistor to a supply voltage.

8. A magnetometer, according to claim 1, comprising a sensing circuit and a measurement circuit, the sensing circuit comprising the sensing coil and the comparator circuit, the measurement circuit comprising a microcontroller, wherein the comparator circuit and the microcontroller are integrated in an integrated circuit.

9. A magnetometer according to claim 8, comprising at least one further sensing circuit comprising a further sensing coil, wherein said further sensing coil has a magnetic axis with a directional component orthogonal to the magnetic axis of the sensing coil 10. A digital compass for mobile application comprising a magnetometer according to claim 1.

11. A method for operating a magnetometer according to claim 1, wherein the relaxation oscillator is stimulated to oscillate by means of the comparator, wherein the comparator is fed back by the sensing coil and by the feedback resistor, wherein the inductance of the sensing coil is determined by analyzing the oscillating frequency of the relaxation oscillator, wherein the first input node of the comparator is controlled by the alternating first input signal and wherein the second node is controlled by the inversely alternating second input signal.

12. A method according to claim 11, wherein the first input signal is provided by a first external voltage source and the second input signal is provided by a second external voltage source, wherein the first and the second external voltage sources are integrated into a microcontroller and wherein the comparator is integrated into the microcontroller.

* * * * *